(12) United States Patent
Senga

(10) Patent No.: US 7,301,106 B2
(45) Date of Patent: Nov. 27, 2007

(54) IMAGE FORMING APPARATUS AND ELECTRONIC APPARATUS

(75) Inventor: Shotaro Senga, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 0 days.

(21) Appl. No.: 11/262,982

(22) Filed: Nov. 1, 2005

(65) Prior Publication Data

US 2006/0094264 A1    May 4, 2006

(30) Foreign Application Priority Data

Nov. 1, 2004    (JP) ............................. 2004-318527

(51) Int. Cl.
*H05K 1/16* (2006.01)
(52) U.S. Cl. .................. 174/260; 361/772; 361/776
(58) Field of Classification Search .............. 361/776, 361/794, 767, 774, 777–779; 174/260
See application file for complete search history.

(56) References Cited

U.S. PATENT DOCUMENTS 4,949,223 A * 8/1990 Achiwa .................. 361/776
6,700,204 B2 * 3/2004 Huang et al. ............... 257/774
6,740,822 B2 * 5/2004 Watanabe .................... 174/260

FOREIGN PATENT DOCUMENTS

| JP | 06-045761 A | 2/1994 |
| JP | 10-284846 A | 10/1998 |
| JP | 11-017297 A | 1/1999 |

* cited by examiner

*Primary Examiner*—Jeremy C Norris
(74) *Attorney, Agent, or Firm*—Crowell & Moring LLP

(57) ABSTRACT

In a laser beam printer, an elastic conductive member is disposed between a rotating axis of a transfer roller and a land portion of a power supply circuit board and the transfer roller is electrically connected to the power supply circuit board through the elastic conductive member. A front end portion of the elastic conductive member is pressed onto the land portion by its elastic force to come into contact with a solder pad formed on the surface of the land portion for electrical connection. A resist film is partially formed on the surface of the land portion and the solder pad is formed on the region on the land portion that is not covered with the resist film. Thus, a large contact area between the front end portion of the elastic conductive member and the solder pad is ensured so as to address a high voltage applied to the transfer roller. As a result, the transfer roller, etc. can be electrically connected to the power supply circuit board with certainty without increasing the number of components.

5 Claims, 3 Drawing Sheets

IMAGE FORMING APPARATUS AND ELECTRONIC APPARATUS

BACKGROUND OF THE INVENTION

1. Field of the Invention

The present invention relates to an electronic apparatus having a power supply circuit board for supplying electric power to each component, in particular, an image forming apparatus for forming an image on recording paper.

2. Description of the Related Art

Conventionally, in a laser beam printer, a front end of a wire extended from each of components such as a transfer roller, a charger and a developing unit is connected to a power supply circuit board by screwing or soldering to supply electric power to the transfer roller, and so on. With such configuration, time and effort for screwing or soldering cause the increase in costs of the printer. Then, there are considered various types of configuration in which electric power can be supplied to the transfer roller and so on without performing screwing or soldering.

For example, a printer shown in FIG. 4 is configured so that electric power may be supplied to each component through a conductive member arranged from each of the transfer roller and so on to the power supply circuit board. In such a configuration, by bringing a jumper cable 120 arranged on a component mounting plane of the power supply circuit board 112 into contact with a front end portion 131 of a conductive member 130, electrical connection between them is ensured. However, even with such a configuration, since a number of the jumper cable 120 must be provided on the power supply circuit board 112 according to the number of components requiring power supply, the number of components cannot be reduced.

Besides, Japanese Laid-Open Patent Publication No. 11-17297 discloses a circuit board equipped with a via hole conductor made of copper or the like. Japanese Laid-Open Patent Publication No. 10-284846 discloses a ball grid array configuration in which a semiconductor component is installed on a circuit board through a solder. Japanese Laid-Open Patent Publication No. 6-45761 discloses a configuration in which, by pouring a solder into a via hole on a circuit board with multilayer structure, a circuit of each layer is shorted.

SUMMARY OF THE INVENTION

To solve the above-mentioned problem, an object of the present invention is to provide an image forming apparatus and an electronic apparatus in which a transfer roller and so on can be electrically connected to a power supply circuit board with certainty without increasing a number of components, thereby reducing the costs.

An electronic apparatus in accordance with an aspect of the present invention includes a power supply circuit board for supplying electric power, and an elastic conductive member provided from each component of the apparatus to a position facing the power supply circuit board so as to electrically connect each component to the power supply circuit board. The power supply circuit board has a land portion that forms a part of the power supply circuit at a position facing a front end portion of the elastic conductive member, and a solder pad that makes contact with the elastic conductive member is formed on a surface of the land portion. The front end portion of the elastic conductive member is pressed onto the solder pad by elastic force of the elastic conductive member, thereby the front end portion of the elastic conductive member and the solder pad are contacted to be electrically connected.

According to such a configuration, since the front end portion of the elastic conductive member is pressed by the elastic force of the elastic conductive member to contact with the solder pad for electrical connection, the jumper cable or the like which was conventionally needed becomes unnecessary, and thus, a photoconductive drum and so on can be electrically connected to the power supply circuit board with certainty without increasing the number of components. Thereby, the costs of the image forming apparatus can be reduced. Furthermore, since the solder pad is formed on the land portion simultaneously with reflow soldering or dip soldering of the power supply circuit board, any additional process is not required, further reduction in costs can be achieved. As a result, each component of the apparatus can be electrically connected to the power supply circuit board with certainty without increasing the number of components.

According to the above-mentioned configuration, it is preferable that a resist film is partially formed on the surface of the land portion and the solder pad is formed on each region of the land portion that is not covered with the resist film so as to have a flat cross section.

Alternatively, with the above-mentioned configuration, it is preferable that a metal film is partially removed to expose a resin material of the board on the land portion, and a solder pad is formed on each region of the metal film of the land portion so as to be a flat cross section.

According to these configurations, since the land portion is divided into plural regions practically and the solder pad is formed on each region so as to have a flat cross section, the contact area between the front end portion of the elastic conductive member and the solder pad becomes larger and electrical connection between them can be achieved more certainly.

Furthermore, an image forming apparatus in accordance with an aspect of the present invention comprises: a photoconductive drum that a photoconductor is applied on a surface thereof; a charging means for uniformly charging the surface of the photoconductive drum; an exposing means for forming a latent image on the surface of the photoconductive drum by irradiating a laser beam during scanning; a developing means for forming a toner image by adhering toner to a portion of the surface of the photoconductive drum on which the latent image is formed; a transfer means provided at a predetermined transfer position downstream side of the developing means in a rotating direction of the photoconductive drum to be face the surface of the photoconductive drum and for transferring the toner image formed on the photoconductive drum onto a recording paper sheet by charging a surface of the recording paper sheet; a fixing means for fixing toner image on the recording paper sheet by applying predetermined heat and pressure to the recording paper sheet on which the toner image is transferred; a conveying means for conveying the recording paper sheet to the transfer position; a power supply circuit board for supplying electric power to the photoconductive drum, the charging means, the exposing means, the developing means, the transfer means, the fixing means and the conveying means; and an elastic conductive member provided from at least one of the photoconductive drum, the charging means, the exposing means, the developing means, the transfer means, the fixing means and the conveying means to a corresponding position on the power supply circuit board to electrically connect the means to the power supply circuit board.

The power supply circuit board has a land portion that forms a part of a power supply circuit at a position facing a front end portion of the elastic conductive member, and on the land portion, a resist films are partially formed to form a pair of crescent shaped portions surface of which are covered by the resist film or a metal film is partially removed to form a pair of crescent shaped portions where a resin material of the board is exposed. A solder pad that is in contact with the elastic conductive member is formed on each region of the metal film of the land portion so as to have a flat cross section, and the front end portion of the elastic conductive member is pressed onto the solder pad by elastic force of the elastic conductive member so that the front end portion of the elastic conductive member comes into contact with the solder pad for electrical connection.

According to such a configuration, since the front end portion of the elastic conductive member is pressed by the elastic force itself to come into contact with the solder pad for electrical connection, the jumper cable which was conventionally needed becomes unnecessary, and thus, the photoconductive drum and so on can be electrically connected to the power supply circuit board with certainty without increasing the number of components. As a result, costs of the image forming apparatus can be reduced.

Furthermore, the resist film can be formed on the land portion simultaneously with the formation of the resist film for covering the whole power supply circuit board. Alternatively, the metal film can be removed simultaneously with removing the metal film for forming conductive pattern of the power supply circuit board by etching process. Still furthermore, the solder pad can be formed on the land portion concurrently with reflow soldering or dip soldering of the power supply circuit board. Thus, any additional process is not required, so that the cost for manufacturing the power supply circuit board may not be increased.

Still furthermore, the metal film of the land portion is divided into plural regions practically and the solder pad is formed on each region so as to have a flat cross section. Thus, the contact area between the front end portion of the elastic conductive member and the solder pad becomes larger and electrical connection between them can be achieved more certainly. As a result, at least one of the photoconductive drum, the charging means, the exposing means, the developing means, the transfer means, the fixing means and the conveying means can be electrically connected to the power supply circuit board with certainty without increasing the number of components.

DETAILED DESCRIPTION OF THE EMBODIMENT

Figure 1:
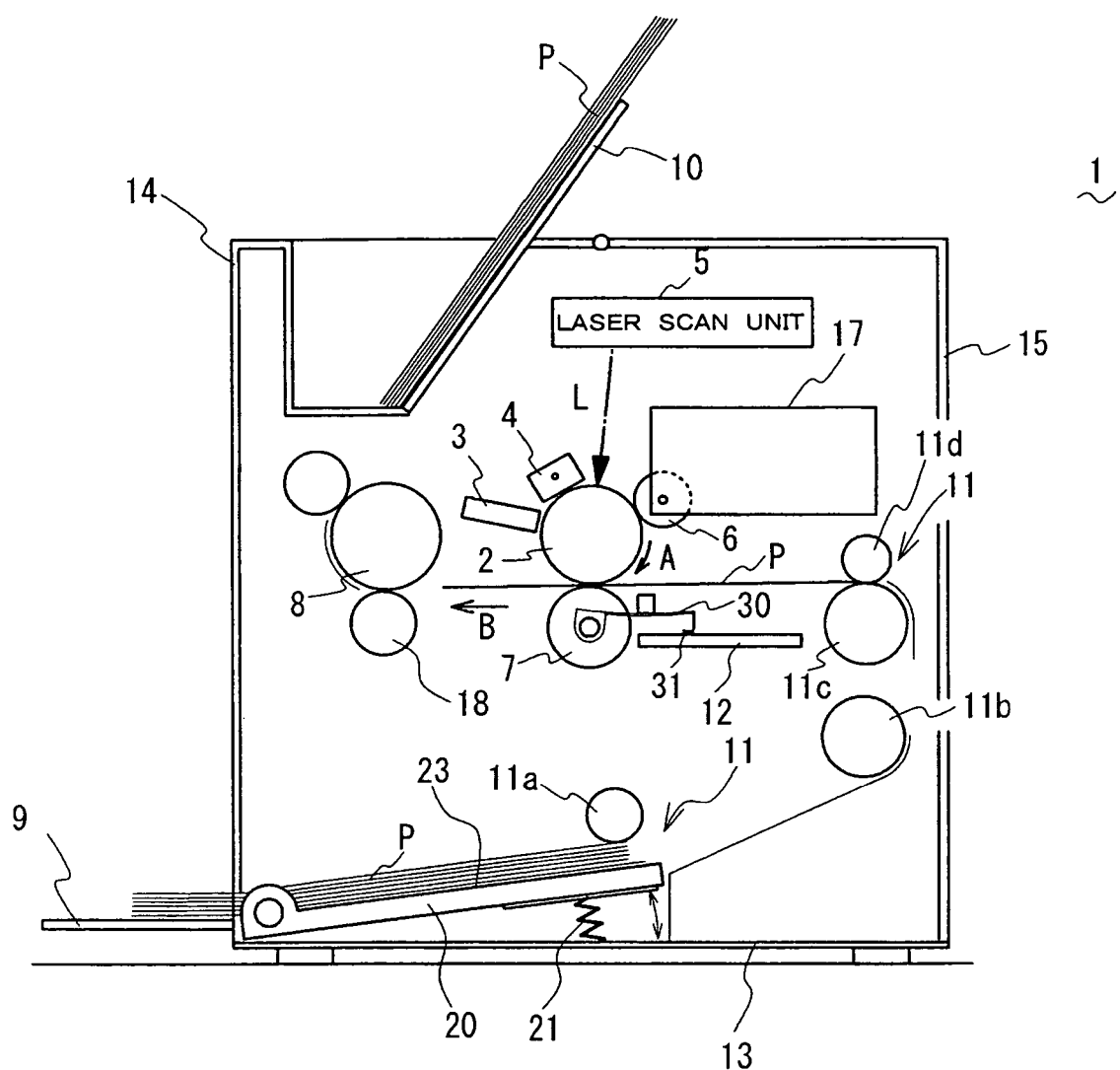
FIG. 1 is a view showing a configuration of a laser beam printer as an example of an electronic apparatus in accordance with an embodiment of the present invention.

A laser beam printer which is an example of an electronic apparatus in accordance with an embodiment of the present invention will be described with reference to drawings. FIG. 1 shows a constitutional example of a laser beam printer 1. The laser beam printer 1 is comprised of a photoconductive drum 2 on which a photoconductor is applied, a cleaner 3, a charger (charging means) 4, a laser scan unit (exposing unit) 5, a developing brush (developing means) 6 and a transfer roller (transfer means) 7, which are disposed around the photoconductive drum 2 toward the downstream side from the upstream side of a rotation direction A in this order, a fixing roller (fixing means) 8 disposed downstream of the transfer roller 7 in a conveying direction of recording paper sheet P, a paper sheet feed tray 9 on which the recording paper sheets P are loaded, a paper sheet exit tray 10 on which printed recording paper sheets P are placed, a recording paper sheet conveying mechanism (conveying means) 11, a power supply circuit board 12, and so on. Each of the components is attached to a metal frame 13 disposed on a bottom or the like of the laser beam printer 1. The metal frame 13 is equipped with a housing 14 for covering each component and forming an exterior package of the laser beam printer 1. A door member 15, through which the recording paper sheet P jammed on the recording paper sheet conveying mechanism 11 is removed or a toner cartridge 17 described later is exchanged, is formed on the upper portion of the housing 14 so as to be freely opened or closed.

The cleaner 3 removes toner and paper dust adhered on a surface of the photoconductive drum 2 in the previous operation (one rotation before) so as to clean the surface of the photoconductive drum 2. The charger 4 uniformly charges the surface of the photoconductive drum 2 cleaned by the cleaner 3. The laser scan unit 5 irradiates a laser beam L on the surface of the photoconductive drum 2 charged by the charger 4 during scanning to form a latent image. Electric power is supplied to the laser scan unit 5 by a power supply circuit board 12 so that a light-emitting voltage for light emission of the laser diode is applied. The developing brush 6 is attached to the toner cartridge 17 that stores toner therein, and applies the toner to a portion of the photoconductive drum 2 on which the latent image is formed to form a toner image. The transfer roller 7 is provided to face the surface of the photoconductive drum 2, and charges the surface of the recording paper sheet P while pressing the recording paper sheet P to the surface of photoconductive drum 2 so as to transfer the toner image formed on the surface of the photoconductive drum 2 on the recording paper sheet P. A transfer voltage for charging the surface of the recording paper sheet P is applied to the transfer roller 7 from the power supply circuit board 12. The fixing roller 8 nips the recording paper sheet P with a roller 18 disposed at a position facing thereto, and applies heat and pressure to the recording paper sheet P to fix the toner. Heat for fixing the toner is supplied from a heater (for example, halogen lamp, etc.) built in the fixing roller 8. A fixing voltage generated by the power supply circuit board 12 is applied to the heater.

The recording paper sheet conveying mechanism 11 has a pickup roller 11a, conveying rollers 11b, 11c and 11d, a paper sheet loading plate 20 disposed in the vicinity of the paper sheet feed tray 9 for pressing the loaded recording paper sheet 9 against the pickup roller 11a and a metal coil spring 21 for pressing the paper sheet loading plate 20 to the side of the pickup roller 11a.

A recording paper sheet mounting plane 23 on which the recording paper sheets P are loaded is consecutively formed with the paper sheet feed tray 9 and the paper sheet loading board 20. By inserting multiple recording paper sheets P in the stacked state from the side of the paper sheet feed tray 9 by the user, the recording paper sheets P are mounted on the recording paper sheet mounting plane 23.

The pickup roller 11a disposed for facing the recording paper sheet mounting plane 23 sends a top sheet of the recording paper sheets P mounted on the recording paper sheet mounting plane 23 to the conveying roller 11b. The conveying roller 11b sends the recording paper sheet P sent by the pickup roller 11a to the conveying roller 11c. The conveying rollers 11c and 11d disposed for facing each other between the conveying roller 11b and the transfer roller 7 convey the recording paper sheet P sent by the conveying roller 11b to a transfer position.

Each of the charger 4, the laser scan unit 5, the developing brush 6, the transfer roller 7, the fixing roller 8 and the recording paper sheet conveying mechanism 11 is connected to the power supply circuit board 12 through an elastic conductive member formed by bending a metal plate. FIG. 1 shows only an elastic conductive member 30 connecting the transfer roller 7 to the power supply circuit board 12. An end portion of the elastic conductive member 30 is, for example, supported by a rotating shaft of the transfer roller 7, and the other end portion (front end portion 31) is pressed by an elastic force of the elastic conductive member 30 to the side of the power supply circuit board 12 and is in contact with a solder pad 33 (refer to FIG. 2) formed on the power supply circuit board 12. Thus, the power supply circuit board 12 and the transfer roller 7 are electrically connected to each other through the elastic conductive member 30. Each of the charger 4, the laser scan unit 5, the developing brush 6, the fixing roller 8 and the recording paper sheet conveying mechanism 11 is forced into conduction through an elastic conductive member equivalent to the elastic conductive member 30.

Figure 2:
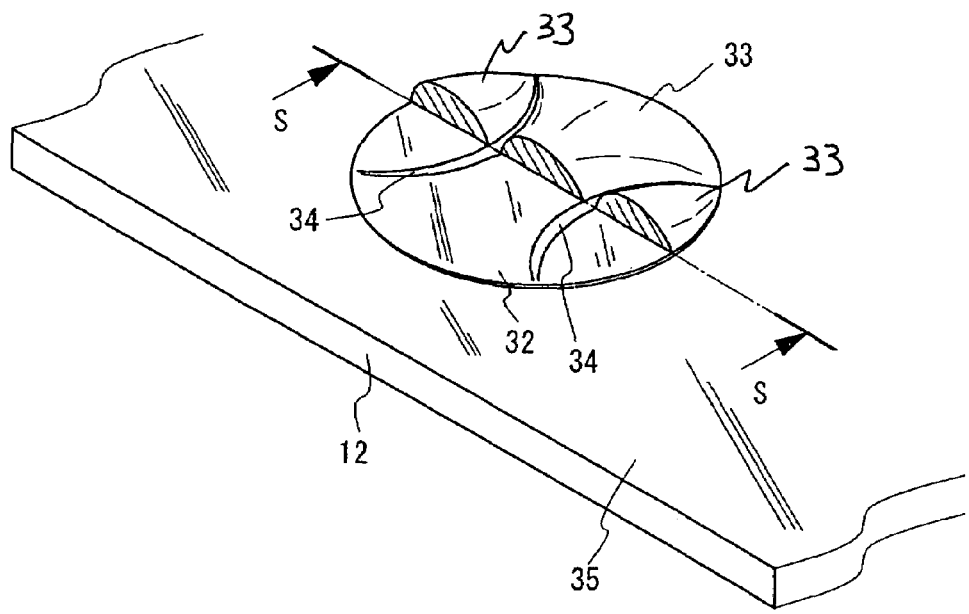
FIG. 2 is a perspective view showing a solder pad formed on a power supply circuit board of the laser beam printer.
Figure 3:
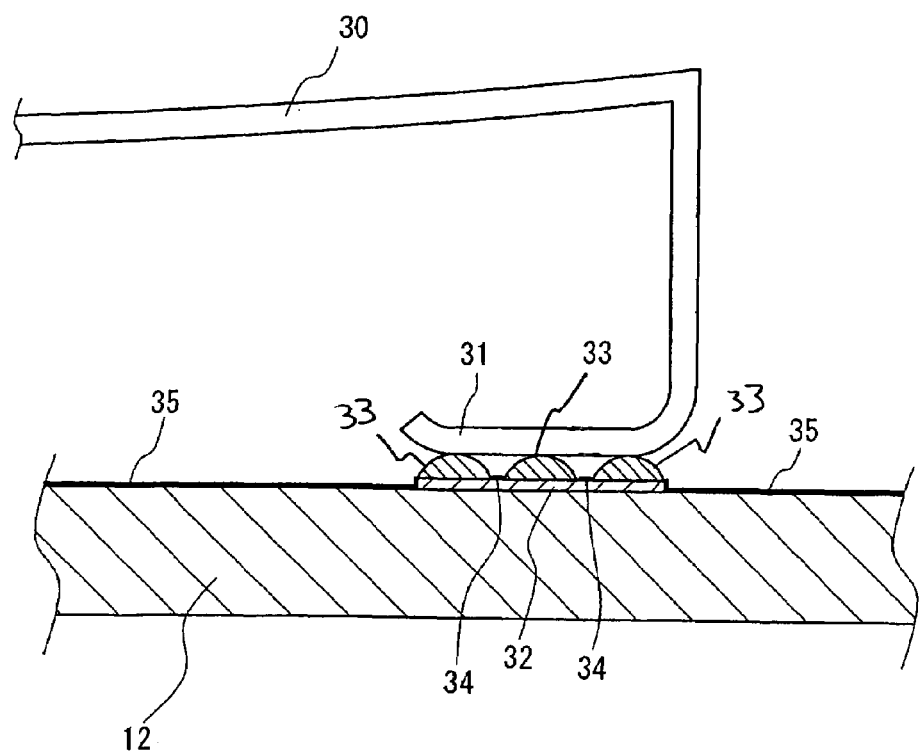
FIG. 3 is a sectional view showing a state where the solder pad is in contact with an elastic conductive member taken along a line S-S.

FIG. 2 shows a land portion 32 on the power supply circuit board 12 that is in contact with the front end portion 31 of the elastic conductive member 30 and the solder pad 33 formed on the surface of the land portion 32. The land portion 32 is formed substantially in the shape of a circle on the surface of the power supply circuit board 12 on which a wiring pattern is formed and is connected to the other land portion by a line portion (not shown). The front end portion 31 of the elastic conductive member 30 comes into contact with the surface of the land portion 32 on which the solder pad 33 for preventing oxidization of the surface is formed.

In the laser beam printer 1 during a printing operation, since a high voltage near to −2000 V needs to be applied to the transfer roller 7, it is necessary to provide an adequate contact area between the front end portion 31 and the solder pad 33 to obtain good conduction characteristics. Then, if the area (radius) of the land portion 32 were set to be larger so as to correspond the above-mentioned high voltage, and the solder pad 33 formed on the land portion 32 might rise greatly due to surface tension. As a result, the contact area between the front end portion 31 of the elastic conductive member 30 and the solder pad 33 might become smaller on the contrary. Thus, in this embodiment, a resist film 34 is partially formed on the surface of the land portion 32 to prevent the surface of the solder pad 33 from rising.

The resist film 34 formed on the surface of the land portion 32 is formed simultaneously with the formation of a resist film 35 for protecting and insulating the wiring pattern of the whole power supply circuit board 12 including the above-mentioned line portion. In this embodiment, a pair of resist films 34 is formed on the surface of land portion 32 and the films are shaped of a crescent in a plan view, are disposed so as to be symmetrical about the center of the land portion 32 and face back-to-back with each other. Since a solder cannot be adhered to the portion covered with the resist films 34, the cross section of the solder pad 33 becomes a flat shape as shown in FIG. 2. Thereby, the contact area between the front end portion 31 of the elastic conductive member 30 and the solder pad 33 becomes larger. Therefore, it is possible to ensure a contact area between the front end portion 31 of the elastic conductive member 30 and the solder pad 33 large enough to address the above-mentioned high voltage.

Figure 4:
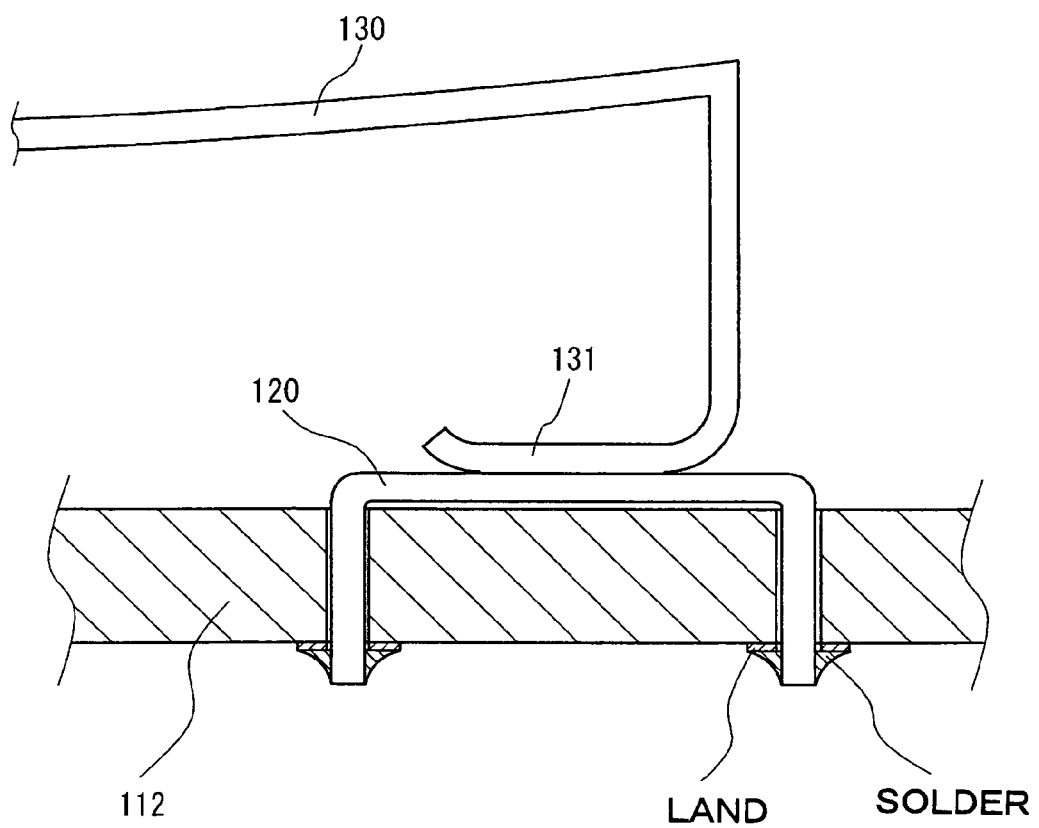
FIG. 4 is a sectional view showing a state where a jumper cable formed on a power supply circuit board of a conventional laser beam printer is in contact with an elastic conductive member.

As described above, according to the laser beam printer 1 of this embodiment, since the front end portion 31 of the elastic conductive member 30 is pressed onto the solder pad 33 by the elastic force of the elastic conductive member 30 itself to be electrically connected to the solder pad 33, the jumper cable 120 conventionally needed (refer to FIG. 4) becomes unnecessary and thus, the transfer roller 7 and the so on can be electrically connected to the power supply circuit board 12 with certainty without increasing the number of components. As a result, costs of the laser beam printer 1 can be reduced. Furthermore, since the resist film 34 can be formed on the land portion 32 simultaneously with the formation of the resist film 35 for covering the whole power supply circuit board 12, and since the solder pad 33 can be formed on the land portion 32 simultaneously with reflow soldering or dip soldering of the power supply circuit board 12, any additional process is not required. Furthermore, a pair of the crescent resist films 34 is formed on the land portion 32 so as to face back-to-back with each other, and the solder pad 33 is formed on each portion of the land portion 32 that is not covered with the resist films 34 so as to have a flat cross section. Thus, the contact area between the front end portion 31 of the elastic conductive member 30 and the solder pad 33 becomes larger and electrical connection between them can be achieved more certainly.

The present invention is not limited to the configuration of the above-mentioned embodiment and various modifications can be made. For example, the above-mentioned configuration is not limited to the laser beam printer 1 and can be widely applied general electronic apparatus as well as other image forming apparatuses such as laser beam-typed copying machines, an ink jet printer, and so on. The shape and number of the resist layers 34 formed on the surface of the land portion 32 is not limited to that of FIG. 2. For example, the resist film 34 may be shaped so as to divide the surface of the land portion 32 into two or four. The resist film 34 may be omitted when a voltage supplied from the power supply circuit board 12 is relatively low and it is unnecessary to ensure a large contact area between the front end portion 31 of the elastic conductive member 30 and the solder pad 33.

Although a pair of the crescent shaped resist films 34 is formed on the surface of the land portion 32 in this embodiment, the present invention is not limited to this. For example, it is possible to remove a metal film of a base material of the board partially by etching without applying a resist film to the region corresponding to the resist films 34 of the land portion 32 so as to expose a resin material of the board while the power supply circuit board 12 is formed by etching the metal film of the base material of the board. According to such a method, the land portion 32 can be practically divided into a plurality of portions. Since a small solder pad is formed on each of the divided portions, the front end portion 31 of the elastic conductive member 30 is in contact with the solder pads 33 at plural positions. As a result, the contact area of the front end portion 31 of the elastic conductive material 30 and the solder pads 33 becomes larger, electrical connection between them can be achieved more certainly.

This application is based on Japanese patent application 2004-318527 filed Nov. 1, 2004 in Japan, the contents of which are hereby incorporated by references.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

What is claimed is:

1. An electronic apparatus comprising:
   a power supply circuit board for supplying electric power; and
   an elastic conductive member provided from each component of the apparatus to a corresponding position on the power supply circuit board so as to electrically connect each component to the power supply circuit board, wherein
   the power supply circuit board has a land portion that forms a part of a power supply circuit at a position facing a front end portion of the elastic conductive member;
   solder pads, that make contact with the elastic conductive member, are formed on a surface of the land portion simultaneously with reflow soldering or dip soldering of the power supply circuit board; and
   the elastic conductive member is positioned and oriented with respect to the power supply circuit board in such a way that a front end portion of the elastic conductive member is held in electrical contact with the solder pads at plural positions by elastic force of the elastic conductive member itself.

2. The electronic apparatus in accordance with claim 1, wherein
   a resist film is partially formed on the surface of the land portion and the solder pads are formed on regions of the land portion that are not covered with the resist film so as to have a flat cross section.

3. The electronic apparatus in accordance with claim 2, wherein
   the resist film is formed to be a pair of crescent shapes in a plan view which are disposed so as to be symmetrical about the center of the land portion and face back-to-back with each other.

4. The electronic apparatus in accordance with claim 1, wherein
   a metal film of a base material of the power supply circuit board is partially removed to expose a resin material of the base material on the land portion, and a solder pad is formed on each region of the metal film of the land portion so as to have a flat cross section.

5. The electronic apparatus in accordance with claim 4, wherein
   the metal film is removed to form a pair of crescent shapes in a plan view which are disposed so as to be symmetrical about the center of the land portion and face back-to-back with each other.

* * * * *